US009728865B1

(12) United States Patent
Voli

(10) Patent No.: US 9,728,865 B1
(45) Date of Patent: Aug. 8, 2017

(54) SEALED, SOLDERLESS, REPLACEABLE, ELECTRICAL CONNECTOR

(71) Applicant: SYMBOL TECHNOLOGIES, LLC, Lincolnshire, IL (US)

(72) Inventor: Edward M. Voli, East Setauket, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 0 days.

(21) Appl. No.: 15/096,794

(22) Filed: Apr. 12, 2016

(51) Int. Cl.

| | |
|---|---|
| ***H01R 12/00*** | (2006.01) |
| ***H05K 1/00*** | (2006.01) |
| ***H01R 4/48*** | (2006.01) |
| ***H01R 12/71*** | (2011.01) |
| ***H01R 13/52*** | (2006.01) |
| ***H01R 12/70*** | (2011.01) |

(52) U.S. Cl.
CPC ....... *H01R 4/4809* (2013.01); *H01R 12/7076* (2013.01); *H01R 12/714* (2013.01); *H01R 13/5219* (2013.01)

(58) Field of Classification Search
CPC .............. H01R 4/4809; H01R 13/5219; H01R 12/7076; H01R 12/714
USPC .................................................. 439/81, 76.1
See application file for complete search history.

(56) References Cited

U.S. PATENT DOCUMENTS

| | | | |
|---|---|---|---|
| 4,709,973 | A | 12/1987 | Waters et al. |
| 5,194,010 | A | 3/1993 | Dambach et al. |
| 5,451,158 | A | 9/1995 | Lin et al. |
| 5,876,220 | A | 3/1999 | Yeh |
| 6,383,010 | B1 | 5/2002 | Mayo et al. |
| 6,663,425 | B1 | 12/2003 | Zhang et al. |
| 7,438,582 | B2 | 10/2008 | Taylor |
| 7,833,025 | B2 | 11/2010 | Voli et al. |
| 8,180,397 | B2 * | 5/2012 | Stenmark .......... H04M 1/72527 455/557 |
| 2002/0115344 | A1 | 8/2002 | Chen |
| 2006/0128213 | A1 | 6/2006 | Higeta et al. |

FOREIGN PATENT DOCUMENTS

| | | |
|---|---|---|
| EP | 0509380 | 10/1992 |
| WO | 2010068322 | 6/2010 |

OTHER PUBLICATIONS

International Search Report and Written Opinion dated Jan. 11, 2010 in related case PCT/US2009/057676.

* cited by examiner

*Primary Examiner* — Javaid Nasri

(57) ABSTRACT

Described herein is an electrical connector. One embodiment takes the form of an electrical connector that includes a pogo-pin connector having: a pogo-pin-connector longitudinal axis, a first end compressible along the pogo-pin-connector longitudinal axis, and a second end; and a leaf-spring connector having: a leaf-spring-connector longitudinal axis, a first end that is mechanically and electrically connected to the second end of the pogo-pin connector at a junction point, and a second end that comprises a contact portion; wherein when the pogo-pin connector and the leaf-spring connector are connected, (i) the pogo-pin-connector longitudinal axis and the leaf-spring-connector longitudinal axis are substantially parallel and (ii) the contact portion of the leaf-spring connector is configured to exert a force substantially normal to the substantially parallel longitudinal axes.

19 Claims, 9 Drawing Sheets

SEALED, SOLDERLESS, REPLACEABLE, ELECTRICAL CONNECTOR

BACKGROUND OF THE INVENTION

In various electronic devices, arrangements of electrical components may prohibit the use of some standard electrical connectors and some assembly methods. Also, soldered electrical connections may hinder attempts to repair electronic devices.

Accordingly, there is a need for a sealed, solderless, replaceable electrical connector.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1A:
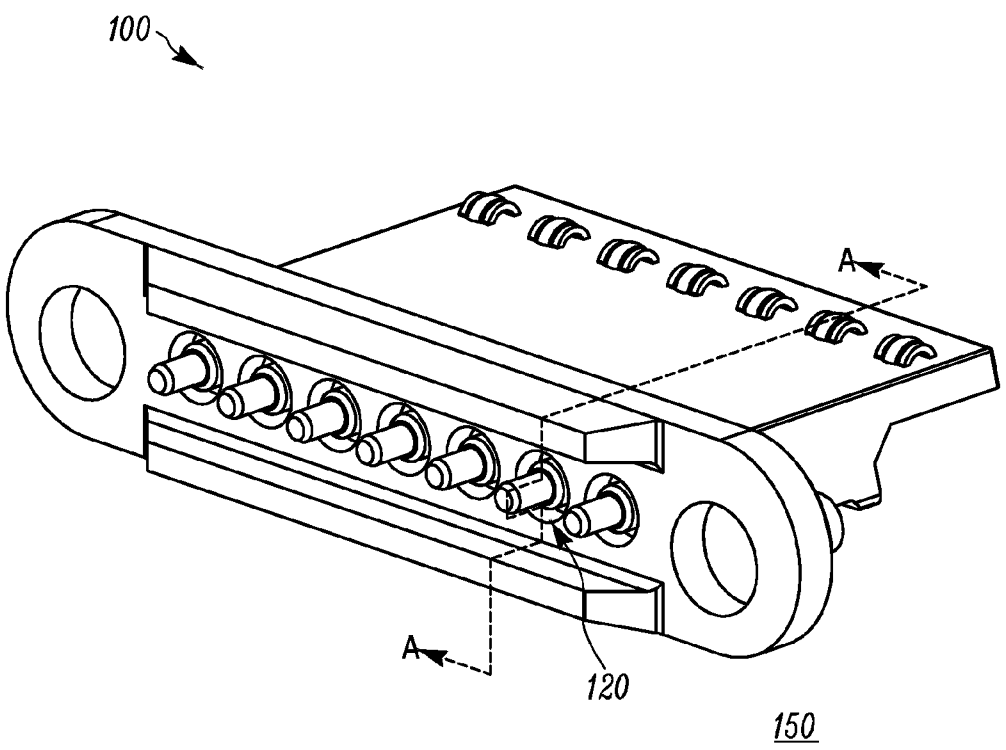
FIG. 1A depicts a perspective view of an electrical connector, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

One embodiment takes the form of an electrical connector that includes a pogo-pin connector comprising a compressible first end and a second end; a leaf-spring connector that includes (i) a first end that is mechanically and electrically connected to the second end of the pogo-pin connector at a junction point and (ii) a second end that includes a contact portion; and a connector housing configured to retain the connected pogo-pin connector and leaf-spring connector such that: the first end of the pogo-pin connector protrudes through a pogo-pin opening in the connector housing; and the contact portion of the leaf-spring connector is configured to provide an electrical path to a contact pad of a printed circuit board (PCB) disposed adjacent to the leaf-spring connector.

In one embodiment, the electrical connector further includes an ingress protection seal at the pogo-pin opening.

In one embodiment, the connector housing further includes at least one through hole.

In one embodiment, the leaf-spring-connector contact portion is configured to deflect when providing an electrical path to the adjacent PCB contact pad.

In one embodiment, the electrical connector further includes a plurality of connector assemblies, each of the plurality of connector assemblies including a pogo-pin connector having a pogo-pin-connector first end and a leaf-spring connector having a leaf-spring-connector second end on the respective one of the plurality of connector assemblies, and wherein: the connector housing further comprises a plurality of pogo-pin openings; the pogo-pin-connector first end of each one of the plurality of connector assemblies is configured to pass through a respective one of the plurality of pogo-pin openings; and the leaf-spring-connector second end of each one of the plurality of connector assemblies is configured to provide an electrical path to a respective one of a plurality of adjacent PCB contact pads.

In one embodiment, the junction point comprises a fork connection.

In one embodiment, the pogo-pin connector further includes a pogo-pin-connector longitudinal axis, wherein: the first end is compressible along the pogo-pin-connector longitudinal axis; the leaf-spring connector further comprises a leaf-spring-connector longitudinal axis; and when the pogo-pin connector and the leaf-spring connector are connected, (i) the pogo-pin-connector longitudinal axis and the leaf-spring-connector longitudinal axis are substantially parallel, and (ii) the contact portion of the leaf-spring connector is configured to exert a force substantially normal to the substantially parallel longitudinal axes.

In one embodiment, the connector housing further includes a leaf-spring opening, and wherein the contact portion of the leaf-spring connector is configured to protrude through the leaf-spring opening.

Another embodiment takes the form of an electronic device that includes a printed circuit board (PCB) including a contact pad; an electrical connector including: a pogo-pin connector including a compressible first end and a second end; a leaf-spring connector including (i) a first end that is mechanically and electrically connected to the second end of the pogo-pin connector at a junction point and (ii) a second end that includes a contact portion; and a connector housing configured to retain the connected pogo-pin connector and leaf-spring connector such that: the first end of the pogo-pin connector protrudes through a pogo-pin opening in the connector housing; and the contact portion of the leaf-spring connector is configured to provide an electrical path to an adjacent PCB contact pad; and a device housing configured to (i) house the PCB and (ii) receive the electrical connector, wherein when the device housing receives the electrical connector, the PCB contact pad is adjacent to the second end of the leaf-spring connector, providing an electrical path from the PCB contact pad, through the second end of the leaf-spring connector, through the junction point, and to the first end of the pogo-pin connector.

In one embodiment, the electronic device is configured to receive a battery electrically connected to the first end of the pogo-pin connector.

In one embodiment, a portion of the electrical path between the adjacent PCB contact pad and the contact portion of the leaf-spring connector is a solderless electrical connection.

In one embodiment, the electronic device further includes an ingress-protection seal between the connector housing and the device housing.

In one embodiment, the connector housing further includes at least one through hole and the device housing further includes at least one screw hole, wherein the at least one through hole is configured to align to a respective screw hole to receive a screw.

In one embodiment, the leaf-spring-connector contact portion is configured to deflect when providing an electrical path to the adjacent PCB contact pad.

In one embodiment, the junction point includes a fork connection.

In one embodiment, the connector housing further includes a leaf-spring opening, wherein the contact portion of the leaf-spring connector is configured to protrude through the leaf-spring opening.

Another embodiment takes the form of an electrical connector that includes: a pogo-pin connector that includes: a pogo-pin-connector longitudinal axis, a first end compressible along the pogo-pin-connector longitudinal axis, and a second end; and a leaf-spring connector that includes: a leaf-spring-connector longitudinal axis, a first end that is mechanically and electrically connected to the second end of the pogo-pin connector at a junction point, and a second end that includes a contact portion; wherein when the pogo-pin connector and the leaf-spring connector are connected, (i) the pogo-pin-connector longitudinal axis and the leaf-spring-connector longitudinal axis are substantially parallel and (ii) the contact portion of the leaf-spring connector is configured to exert a force substantially normal to the substantially parallel longitudinal axes.

In one embodiment, the junction point comprises a fork connection.

In one embodiment, the electrical connector further includes a connector housing configured to retain the connected pogo-pin connector and the leaf-spring connector such that: the first end of the pogo-pin connector protrudes through a pogo-pin opening in the connector housing; and the contact portion of the leaf-spring connector is configured to provide an electrical path to an adjacent printed circuit board (PCB) contact pad.

In one such embodiment, the connector housing further includes a leaf-spring opening, wherein the contact portion of the leaf-spring connector is configured to protrude through the leaf-spring opening.

Moreover, any of the variations and permutations described herein can be implemented with respect to any embodiments, including with respect to any method embodiments and with respect to any system embodiments. Furthermore, this flexibility and cross-applicability of embodiments is present in spite of the use of slightly different language (e.g., process, method, steps, functions, set of functions, and the like) to describe and or characterize such embodiments.

Before proceeding with this detailed description, it is noted that the entities, connections, arrangements, and the like that are depicted in and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—can only properly be read as being constructively preceded by a clause such as "In at least one embodiment, . . . " And it is for reasons akin to brevity and clarity of presentation that this implied leading clause is not repeated ad nauseum in this detailed description.

FIG. 1A depicts a perspective view of an electrical connector, in accordance with some embodiments. In particular, FIG. 1A depicts the perspective view 150. The perspective view 150 includes an electrical connector 100 and shows a pogo-pin opening 120 in the connector housing 118 (FIG. 1C) and a cross-section line AA.

Figure 1B:
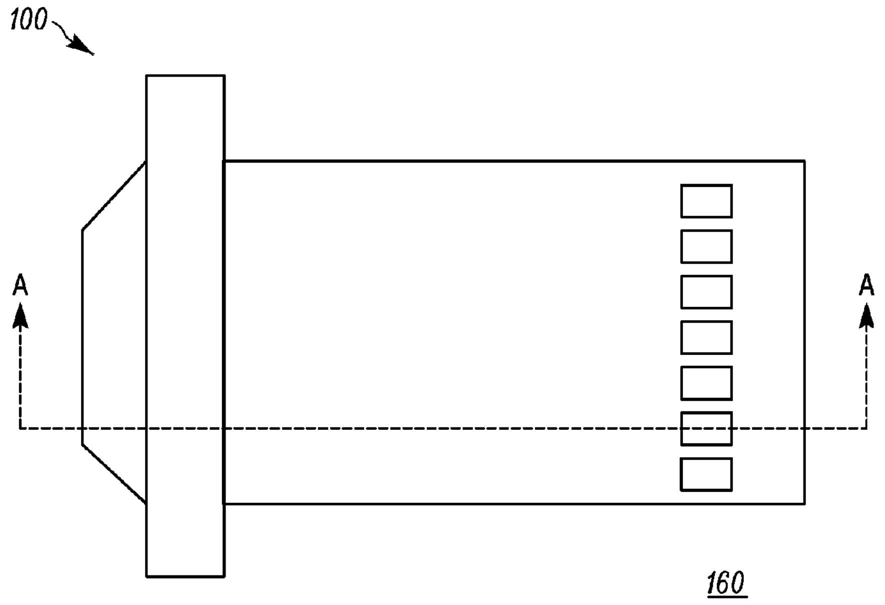
FIG. 1B depicts an overhead view of an electrical connector, in accordance with an embodiment.
Figure 1C:
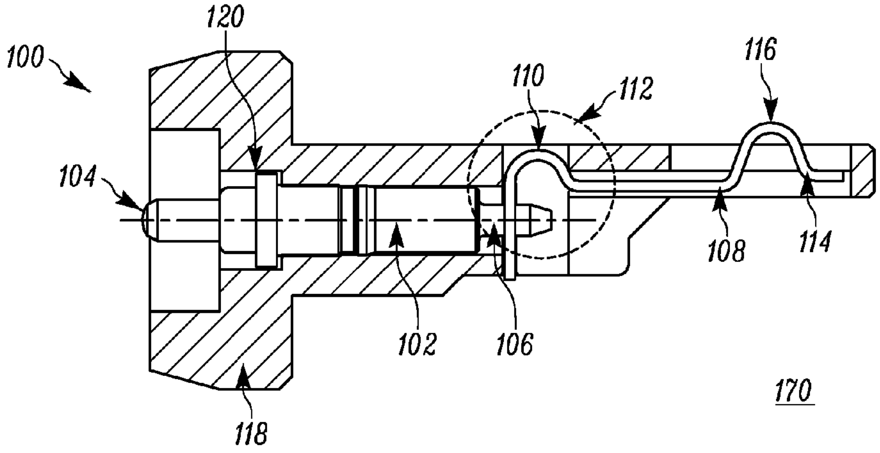
FIG. 1C depicts a cross-sectional view of an electrical connector, in accordance with an embodiment.

FIG. 1B depicts an overhead view of an electrical connector, in accordance with an embodiment. FIG. 1C depicts a cross-sectional view of an electrical connector, in accordance with an embodiment. In particular, FIG. 1B depicts the overhead view 160 of the electrical connector 100, and FIG. 1C depicts the cross-sectional view 170 of the electrical connector 100. The overhead view 160 depicts the location of the cross-section line AA, at the same location as the cross-section line AA of the view 150 in FIG. 1A. The cross-sectional view 170 includes a pogo-pin connector 102 that includes: a compressible first end 104 and a second end 106, a leaf-spring connector 108 that includes: a first end 110, a junction point 112, a second end 114, and a contact portion 116; and a connector housing 118, and a pogo-pin opening 120.

The pogo-pin connector 102 includes any compressible spring-type connector. The term 'pogo-pin connector' as used herein refers to any pogo-pin style of compressible spring-type connector and is not limited to any one brand or manufacturer of pogo-pin connectors. The pogo-pin connector may be plated with an electrically conductive material, such as gold or other suitable conductive materials. The compressible first end 104 is depicted in a decompressed state, extending fully to the left side of the cross sectional view. The compressible first end 106 compress towards the right responsive to a pressure exerted to the right. The compressible first end 106 permits a continuity of an electrical flow path and when relative motion occurs between components mated to the electrical connector 100 and the electrical connector 100. In one embodiment, a battery is mated to the electrical connector 100, and upon a mechanical shock, the compressible first end 104 compresses to absorb the mechanical shock and maintain electrical continuity with the battery.

The leaf-spring connector 108 includes (i) the first end 110 that is mechanically and electrically connected to the second end of the pogo-pin connector at the junction point 112, and (ii) the second end 114 that includes the contact portion 116. The leaf-spring connector is made of an electrically conductive material, and the leaf-spring connector first end 110 is mechanically and electrically connected to the pogo-pin connector second end 106 at the junction point 112. The junction point 112 is the connection between the pogo-pin connector 102 and the leaf-spring connector 108. The junction point 112 includes a connection that provides for a mechanical linkage and an electrical flow path between the pogo-pin connector 102 and the leaf-spring connector 108. Example connections at the junction point include forked connections, press fit connections, solder connections, and the like. The contact portion 116 is located on the leaf-spring connector second end 114 and is configured to provide an electrical path to an adjacent printed circuit board (PCB) contact pad.

The connector housing 118 is configured to retain the connected pogo-pin connector and leaf spring connector such that the pogo-pin connector first end 104 protrudes through the pogo-pin opening 120 and the contact portion 116 is configured to provide an electrical path to an adjacent PCB contact pad.

In accordance with one embodiment, the electrical connector 100 further includes a plurality of connector assemblies, each of the plurality of connector assemblies including a pogo-pin connector 102 having a pogo-pin-connector first end 104 and a leaf-spring connector 108 having a leaf-spring-connector second end 114 on the respective one of the plurality of connector assemblies, and wherein: the connector housing 118 further comprises a plurality of pogo-pin openings 120; the pogo-pin-connector first end 114 of each one of the plurality of connector assemblies is configured to pass through a respective one of the plurality of pogo-pin openings 120; and the leaf-spring-connector second end 114 of each one of the plurality of connector assemblies is configured to provide an electrical path to a respective one of a plurality of adjacent PCB contact pads (such as 304). This is depicted at least in FIGS. 1A-1C. The embodiment of the connector depicted in FIGS. 1A-1C includes seven connector assemblies and seven pogo-pin openings 120, each of the connector assemblies is configured to provide an electrical path between a pogo-pin connector first end 104, through a respective junction point 112, through a respective contact portion 116, to a respective contact pad (such as contact pad 304) on an adjacent PCB (such as PCB 302). In various embodiments, any other number of connector assemblies may be enclosed within a single connector housing 118. Each separate connector assembly may provide an independent electrical path from the first end 104 of the pogo-connector 102, through the junction point 112, to the contact portion 116 from the other connector assemblies. Alternatively, some or all of the connector assemblies may be electrically inter-connected to each other.

Figure 2:
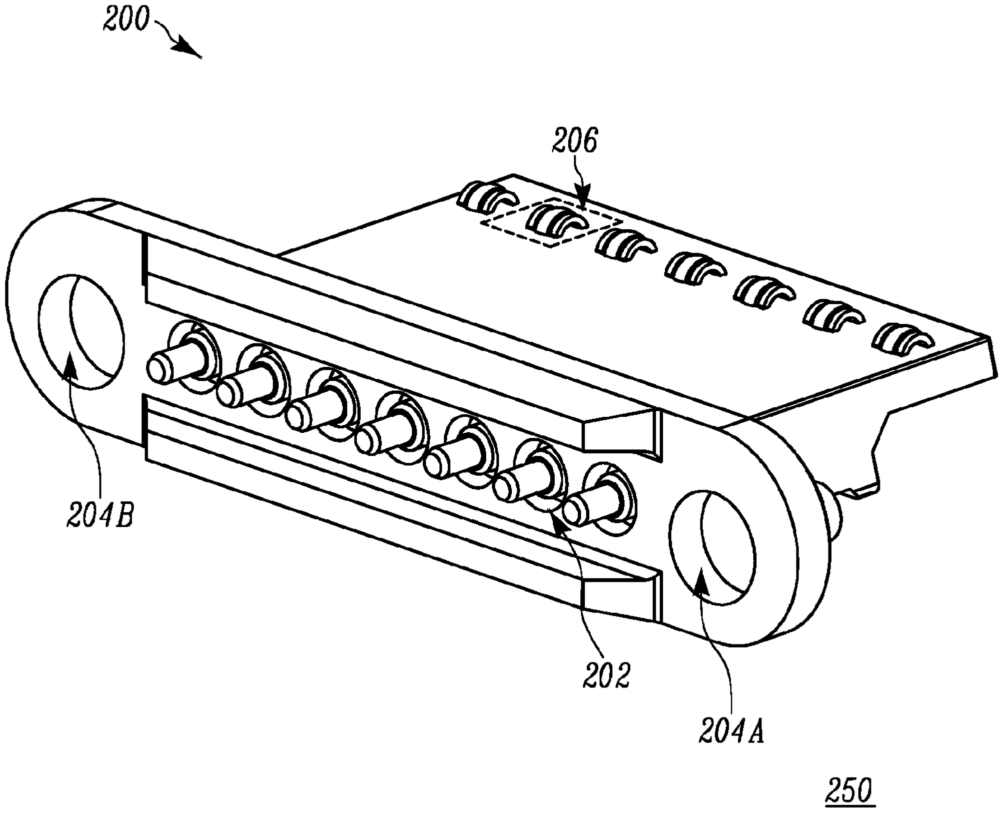
FIG. 2 depicts a perspective view of an electrical connector, in accordance with some embodiments.

FIG. 2 depicts a perspective view of an electrical connector, in accordance with some embodiments. In particular, FIG. 2 depicts the perspective view 200. The perspective view 250 depicts the electrical connector 200, in accordance with some embodiments. The electrical connector 200 is similar to the electrical connector 100, but further includes an ingress protection seal 202 at the pogo-pin opening, at least one through-hole (204A and/or 204B), and a leaf-spring opening 206.

In accordance with one embodiment, the electrical connector 200 includes an ingress protection seal 202. The ingress protection seal 202 is configured to prevent dust and water to pass through the seal. The ingress protection seal 202 may be implemented by way of a tight press-fit of a pogo-pin connector in the housing's pogo-pin opening, a rubber or plastic seal, an adhesive, or another sealing method. In one embodiment, the electrical connector 200 is installed into a housing of an electronic device, such as a wearable scanner depicted in FIGS. 6A-6B, and the ingress protection seal 202 prohibits water and dust from entering the inside of the device housing through the pogo-pin opening 120.

In accordance with one embodiment, the electrical connector 200 includes at least one through hole. FIG. 2 depicts through holes 204A and 204B, each located on opposing sides of the electrical connector housing. The through holes 204A and 204B are configured to receive an attachment screw to attach the electrical connector to a housing of an electronic device. However, other means of attachment are within the scope of the present disclosure and, for example include retention latches, barbs configured to press through the through-holes 204A and 204B, and the like.

In accordance with one embodiment, the electrical connector 100 includes a leaf-spring opening. The leaf-spring opening 206 is an opening in the connector housing that permits at least the contact portion of the leaf-spring connector to protrude through. In embodiments with a plurality of leaf-spring connectors, the leaf-spring opening 206 may be configured to allow a single leaf-spring connector to protrude through, or a plurality of leaf-spring connectors to protrude through.

Figure 3A:
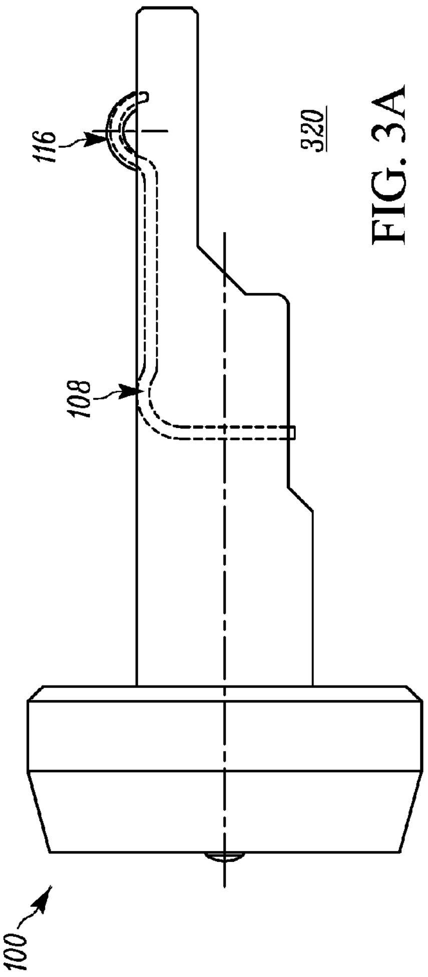
FIG. 3A depicts a side view of an electrical connector, in accordance with some embodiments.

FIG. 3A depicts a side view of an electrical connector, in accordance with some embodiments. In particular, FIG. 3A depicts the views 320. The view 320 includes a side view of the connector 100, that depicts the leaf-spring connector 108 and the contact portion 116.

Figure 3B:
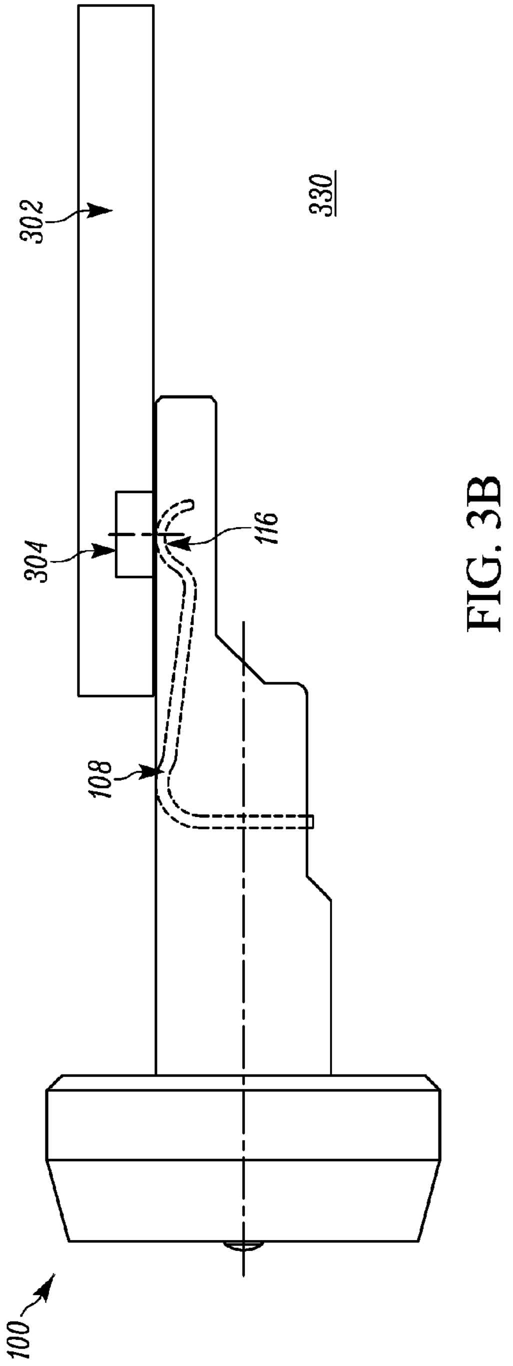
FIG. 3B depicts a side view of an electrical connector adjacent to a printed circuit board, in accordance with some embodiments.

FIG. 3B depicts a side view of an electrical connector adjacent to a printed circuit board, in accordance with some embodiments. In particular, FIG. 3B depicts the view 330. The view 330 includes the elements of the view 320, but also depicts an adjacent printed circuit board (PCB) 302 that includes a contact pad 304.

In the views 320 and 330, the portions of the leaf-spring connector 108 that are internal to the connector housing are depicted with a dashed line.

In accordance with one embodiment, the leaf-spring connector 108, including the contact portion 116, is flexible and is configured to deflect when it contacts and provides an electrical path to the adjacent PCB contact pad 304. In the view 320, there is no adjacent PCB, and the contact portion 116 extends above the surface of the connector housing. However, in the view 330, the PCB 302 is placed next to the connector 100, such that the PCB contact pad 304 contacts the contact portion 116. The leaf-spring connector 108 is deflected downward, and the contact portion 116 is electrically connected to the PCB contact pad 304. In the depicted embodiment of view 330, the contact portion 116 is flush with the top of the connector housing.

Figure 4:
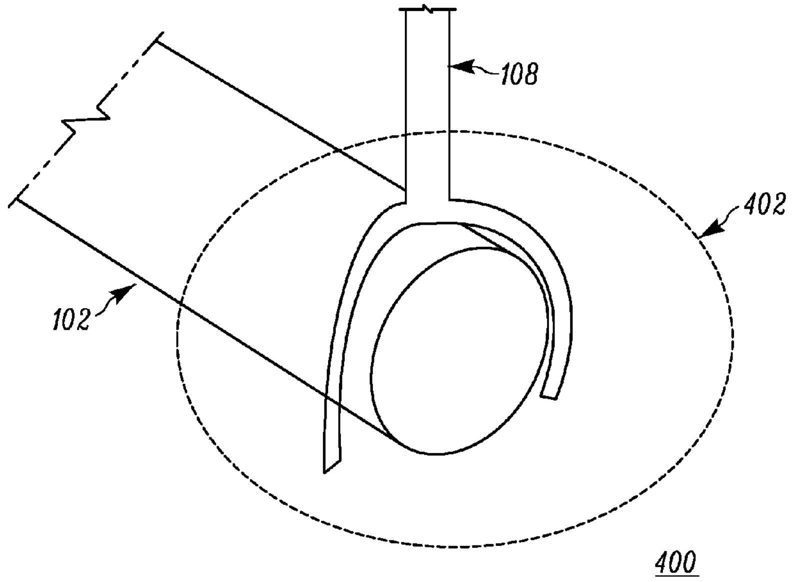
FIG. 4 depicts a view of a fork connection, in accordance with some embodiments.

FIG. 4 depicts a view of a fork connection, in accordance with an embodiment. In particular, FIG. 4 depicts a perspective view 400. The perspective view 400 includes the pogo-pin connector 102, the leaf-spring connector 108, and a fork connection 402. In accordance with an embodiment, the junction point 112 includes a fork connection 402. In the fork connection 402, a portion of the leaf-spring connector 108 is forked to fit around a portion of the pogo-pin connector 102. The fork connection 402 provides for a mechanical and electrical connection between the pogo-pin connector 102 and the leaf-spring connector 108.

Figure 5:
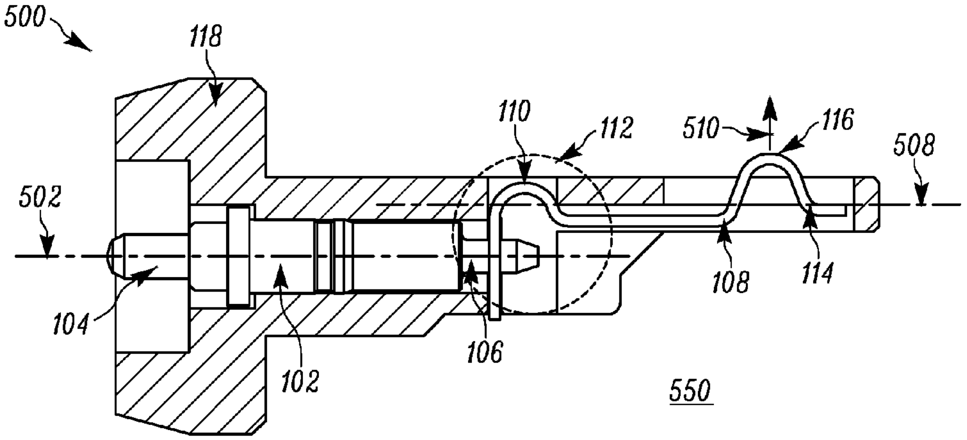
FIG. 5 depicts a cross sectional view of an electrical connector, in accordance with some embodiments.

FIG. 5 depicts a cross sectional view of an electrical connector, in accordance with some embodiments. In particular, FIG. 5 depicts the cross sectional view 550 of the connector 500. The cross-sectional view 550 is taken at a similar point as the cross section AA of FIGS. 1A-1C. As shown in the view 500, the connector 500 includes the same components of the connector 100 depicted in FIGS. 1B-1C, but also includes a pogo-pin longitudinal axis 502, and a leaf-spring connector longitudinal axis 508. FIG. 5 also shows direction of force 510. The pogo-pin connector first end 104 is compressible along the pogo-pin longitudinal axis 502, the pogo-pin-connector longitudinal axis 502 is substantially parallel to the leaf-spring-connector longitudinal axis 508, and the contact portion 116 is configured to exert a force 510 that is substantially perpendicular, or normal, to the longitudinal axes 502 and 508. Depending on the required geometry of an assembled electronic device, the leaf-spring connector may alternatively be configured to exert a force in the opposite direction as the force 510 in order to provide an electrical connection to a contact pad located on the opposing side of the electrical connector.

Figure 6A:
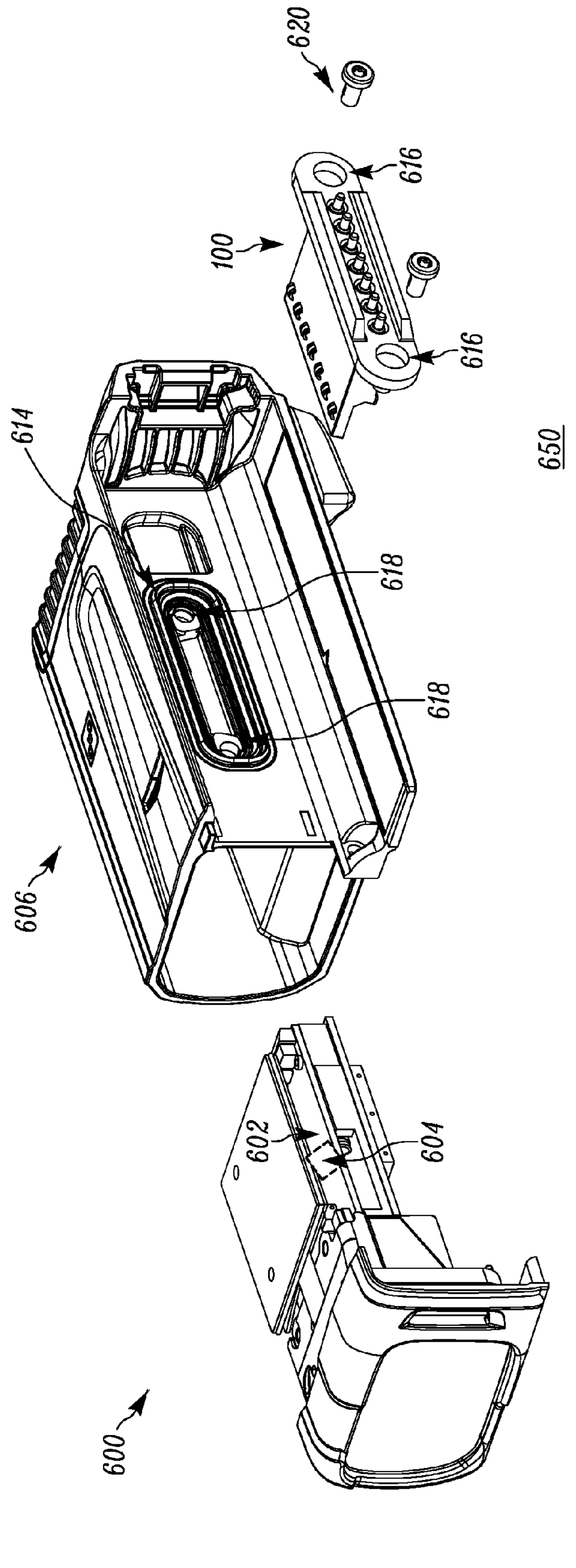
FIG. 6A depicts a partially unassembled view of an electronic device, in accordance with some embodiments.

FIG. 6A depicts a partially unassembled view of an electronic device, such as a wearable scanner, in accordance with some embodiments. In particular, FIG. 6A depicts the view 650 of the electronic device 600. The electronic device 600 includes a PCB 602 having a contact pad 604, a device housing 606 having an ingress protection seal 614, screw holes 618, an electrical connector 100, through holes 616, and screws 620.

Figure 6B:
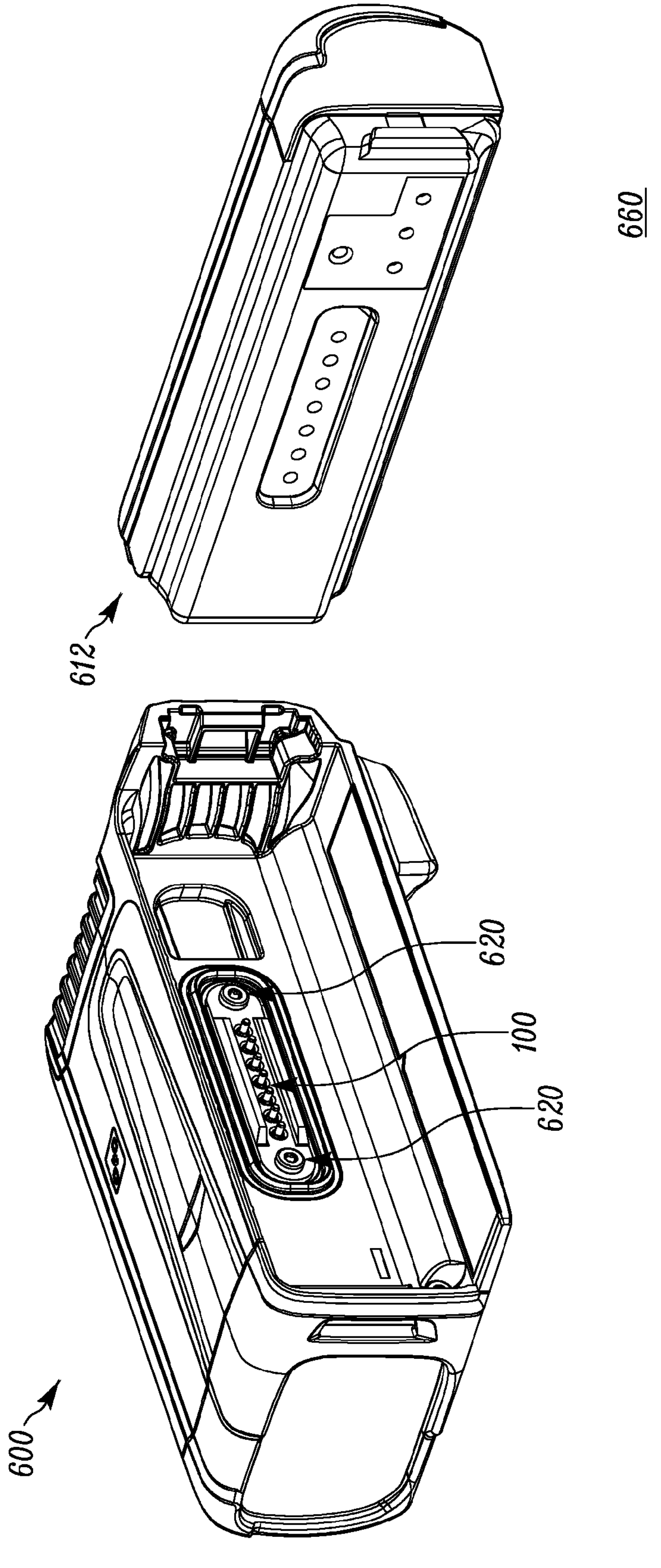
FIG. 6B depicts an assembled view of an electronic device, in accordance with some embodiments.

FIG. 6B depicts an assembled view of an electronic device, in accordance with some embodiments. In particular, FIG. 6B depicts the assembled view 660. The view 660 includes the electronic device 600 with received electrical connector 100, screws 620, and a battery 612.

As shown in the partially unassembled view 650 and the assembled view 660, the PCB 602 having the contact pad 604 is installed into the device housing 606 from the left side of the device housing 606. The device housing 606 is further configured to receive the electrical connector 100 from the right side of the device housing 606. When assembled, an electrical path is formed from the first end of each pogo-pin connector through the leaf-spring connector, and to the PCB contact pad.

In accordance with an embodiment, the electronic device is configured to receive a battery 612 electrically connected to the first end of the pogo-pin connector. The battery 612 of FIG. 6B may be configured to attach to the electronic device 600, and provide electrical power from the battery 612, through a female battery connector associated the battery, through the electrical connector 100, and to the PCB contact pad 604 to provide power to various components on the PCB 602. The electronic device may further be configured to receive power from a corded power supply, or the like.

In one embodiment, the PCB 602 is first housed in the device housing 606, and the electrical connector 100 is then received into the device housing 606. When the electrical connector 100 is installed into the device housing 606, the contact portion of the leaf-spring connector is depressed, or deflected, by the edge of the PCB and the contact portion is in electrical contact with the PCB contact pad 604.

In accordance with an embodiment, the portion of the electrical path between the adjacent PCB contact pad and the contact portion of the leaf-spring connector is a solderless electrical connection.

In accordance with an embodiment, the electronic device further includes and ingress-protection seal between the connector housing and the device housing. As depicted in FIGS. 6A-6B, the ingress-protection seal 614 is positioned to provide a seal to the back side of the housing of the electrical connector 100. The electronic device 600 may also be configured to retain the electrical connector 100. As shown in FIGS. 6A-6B, the screws 620 pass through the through holes 616 on the electrical connector housing and are received by the screw holes 618 on the electronic device housing. The screws, when tightened, compress the electrical connector to the device housing.

While the electronic device 600 has been described as including the electrical connector 100, any of the electrical connectors described herein, such as the electrical connector 500 or 700, may be used.

Figure 7:
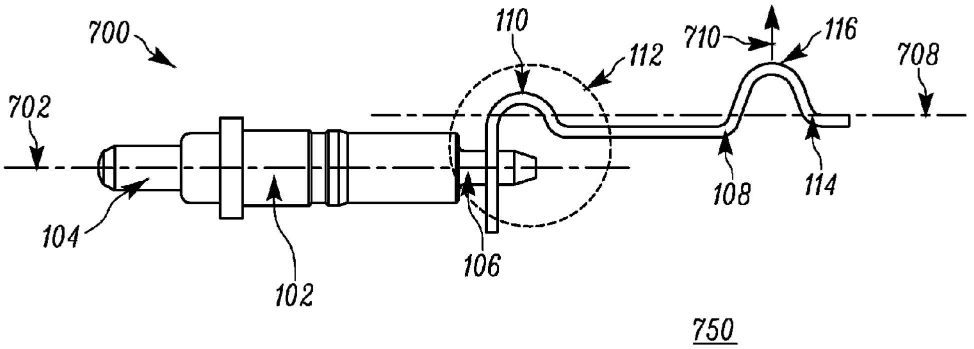
FIG. 7 depicts a cross sectional view of an electrical connector, in accordance with some embodiments.

FIG. 7 depicts a cross sectional view of an electrical connector, in accordance with some embodiments. In particular, FIG. 7 depicts the cross sectional view 750. The cross sectional view 750 depicts a cross section of the electrical connector 700, at a similar cross section as described by cross section AA of FIGS. 1A-1C. The electrical connector 700 includes many of the same components as the electrical connector 100, including a pogo-pin connector having a compressible first end 104 and a second end 108, a leaf-spring connector 108 having a first end 110 and a second end 114; a junction point 112 and a contact portion 116. The electrical connector 700 further includes a pogo-pin-connector longitudinal axis 702, and a leaf-spring-connector longitudinal axis 708. FIG. 7 also depicts a direction of a normal force 710.

The compressible first end 104 is compressible along the pogo-pin-connector longitudinal axis 702. The leaf-spring connector first end is mechanically and electrically connected to the pogo-pin connector second end 106 at the junction point 112. The leaf-spring connector second end 114 includes a contact portion 116. The leaf-spring-connector and pogo-pin-connector longitudinal axes, 708 and 702 respectively, are substantially parallel, and the direction of the force 710 exerted from the contact portion 116 is substantially normal to the substantially parallel axes 708 and 702.

In accordance with an embodiment, the electrical connector 700 may further include a connector housing (such as housing 118) that has a pogo-pin opening (such as opening 120) and a leaf-spring opening (such as opening 206), wherein the first end 104 of the pogo-pin connector 102 is configured to protrude through the pogo-pin opening 120 and the contact portion 116 of the leaf-spring connector 108 is configured to protrude through the leaf-spring opening 206.

Figure 8:
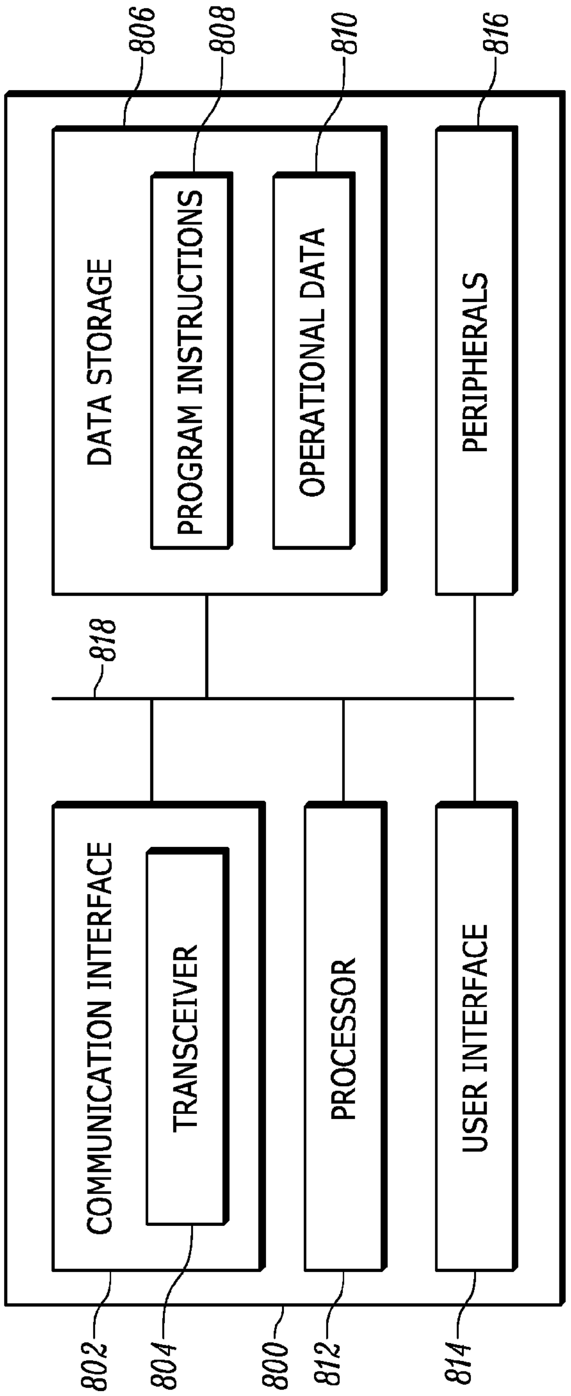
FIG. 8 depicts a block diagram of an electronic device, in accordance with some embodiments.

FIG. 8 depicts a block diagram of an electronic device, in accordance with some embodiments. FIG. 8 depicts a block diagram of a mobile electronic device, in accordance with some embodiments. In particular, FIG. 8 depicts a mobile electronic device 800. The mobile electronic device 800 is representative of the electronic device 600, including a mobile or wearable scanner, and may be configured to incorporate the electrical connector 100, 200, 500, 700, or other similar variations.

The mobile electronic device 800 includes a communications interface 802 (that includes a transceiver 804), data storage 806 (that contains program instructions 808 and operational data 810), a processor 812, a user interface 814, peripherals 816, and a communication bus 818. This arrangement is presented by way of example and not limitation, as other example arrangements could be described here.

The communication interface 802 includes the transceiver 804. The transceiver 804 may be configured (e.g., tuned) to receive and transmit on one of a set of channels. The transceiver 804 may be a single component, or realized as a separate transmitter and receiver, as known by those with skill in the art. The communication interface 802 may be configured to be operable for communication according to one or more wireless-communication protocols, some examples of which include LMR, LTE, APCO P25, ETSI DMR, TETRA, Wi-Fi, Bluetooth, NFC, and the like. The communication interface 802 may also include one or more wired-communication interfaces (for communication according to, e.g., Ethernet, USB, and/or one or more other protocols.) The communication interface 802 may include any necessary hardware (e.g., chipsets, antennas, Ethernet interfaces, etc.), any necessary firmware, and any necessary software for conducting one or more forms of communication with one or more other entities as described herein.

The data storage 806 may take the form of any non-transitory computer-readable medium or combination of such media, some examples including flash memory, read-only memory (ROM), and random-access memory (RAM) to name but a few, as any one or more types of non-transitory data-storage technology deemed suitable by those of skill in the art could be used. As depicted in FIG. 8, the data storage 806 contains program instructions 808 executable by the processor 812 for carrying out various functions described herein, and further is depicted as containing and operational data 810, which may include any one or more data values stored by and/or accessed by the computing device in carrying out one or more of the functions described herein.

The user interface 814 may include one or more input devices (a.k.a. components and the like) and/or one or more output devices (a.k.a. components and the like.) With respect to input devices, the user interface 814 may include one or more touchscreens, buttons, switches, microphones, and the like. With respect to output devices, the user interface 814 may include one or more displays, speakers, light emitting diodes (LEDs), and the like. Moreover, one or more components (e.g., an interactive touchscreen and display of the user interface 814 could provide both user-input and user-output functionality. Other user interface components could also be present, as known to those of skill in the art.

The peripherals 816 may include any computing device accessory, component, or the like, that is accessible to and useable by the computing device during operation. Example peripherals 816 include a GPS receiver, an altimeter, an RSSI sensor, a scanner, including an imager-based and/or laser-based scanner, an RFID data acquisition device, an NFC data acquisition device, or the like.

The various component of the mobile electronic device 800 are all communicatively coupled with one another via a communication bus 818 (or other suitable communication network, or the like.)

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. An electrical connector comprising:
a pogo-pin connector comprising a compressible first end and a second end;
a leaf-spring connector comprising (i) a first end that is mechanically and electrically connected to the second end of the pogo-pin connector at a junction point and (ii) a second end that comprises a contact portion; and
a connector housing configured to retain the connected pogo-pin connector and leaf-spring connector such that:
the first end of the pogo-pin connector protrudes through a pogo-pin opening in the connector housing; and
the contact portion of the leaf-spring connector is configured to provide an electrical path to an adjacent printed circuit board (PCB) contact pad.

2. The electrical connector of claim 1, further comprising an ingress protection seal at the pogo-pin opening.

3. The electrical connector of claim 1, wherein the connector housing further comprises at least one through hole.

4. The electrical connector of claim 1, wherein the leaf-spring-connector contact portion is configured to deflect when providing an electrical path to the adjacent PCB contact pad.

5. The electrical connector of claim 1, further comprising a plurality of connector assemblies, each of the connector assemblies comprising a pogo-pin connector having a pogo-pin-connector first end and a leaf spring connector having a leaf-spring-connector second end on the respective one of the plurality of connector assemblies, and wherein:
the connector housing further comprises a plurality of pogo-pin openings;
the pogo-pin-connector first end of each one of the plurality of connector assemblies is configured to pass through a respective one of the plurality of pogo-pin openings; and
the leaf-spring-connector second end of each one of the plurality of connector assemblies is configured to provide an electrical path to a respective one of a plurality of adjacent PCB contact pads.

6. The electrical connector of claim 1, wherein the junction point comprises a fork connection.

7. The electrical connector of claim 1, wherein:
the pogo-pin connector further comprises a pogo-pin-connector longitudinal axis, wherein:
the first end of the pogo pin connector is compressible along the pogo-pin-connector longitudinal axis;
the leaf-spring connector further comprises a leaf-spring-connector longitudinal axis; and
when the pogo-pin connector and the leaf-spring connector are connected, (i) the pogo-pin-connector longitudinal axis and the leaf-spring-connector longitudinal axis are substantially parallel, and (ii) the contact portion of the leaf-spring connector is configured to exert a force substantially normal to the substantially parallel longitudinal axes.

8. The electrical connector of claim 1, wherein the connector housing further comprises a leaf-spring opening, and wherein the contact portion of the leaf-spring connector is configured to protrude through the leaf-spring opening.

9. An electronic device comprising:
a printed circuit board (PCB) comprising a contact pad;
an electrical connector comprising:
a pogo-pin connector comprising a compressible first end and a second end;
a leaf-spring connector comprising (i) a first end that is mechanically and electrically connected to the second end of the pogo-pin connector at a junction point and (ii) a second end that comprises a contact portion; and
a connector housing configured to retain the connected pogo-pin connector and leaf-spring connector such that:
the first end of the pogo-pin connector protrudes through a pogo-pin opening in the connector housing; and
the contact portion of the leaf-spring connector is configured to provide an electrical path to the PCB contact pad; and
a device housing configured to (i) house the PCB and (ii) receive the electrical connector, wherein when the device housing receives the electrical connector, the PCB contact pad is adjacent to the second end of the leaf-spring connector, providing the electrical path from the PCB contact pad, through the second end of the leaf-spring connector, through the junction point, and to the first end of the pogo-pin connector.

10. The electronic device of claim 9, wherein the electronic device is configured to receive a battery electrically connected to the first end of the pogo-pin connector.

11. The electronic device of claim 9, wherein a portion of the electrical path between the adjacent PCB contact pad and the contact portion of the leaf-spring connector is a solderless electrical connection.

12. The electronic device of claim 9, the electronic device further comprising an ingress-protection seal between the connector housing and the device housing.

13. The electronic device of claim 9, wherein the connector housing further comprises at least one through hole and the device housing further comprises at least one screw hole, wherein the at least one through hole is configured to align to a respective screw hole to receive a screw.

14. The electronic device of claim 9, wherein the leaf-spring-connector contact portion is configured to deflect when providing the electrical path to the adjacent PCB contact pad.

15. The electronic device of claim 9, wherein the junction point comprises a fork connection.

16. The electronic device of claim 9, wherein the connector housing further comprises a leaf-spring opening, wherein the contact portion of the leaf-spring connector is configured to protrude through the leaf-spring opening.

17. An electrical connector comprising:
a pogo-pin connector comprising:
a pogo-pin-connector longitudinal axis,
a first end compressible along the pogo-pin-connector longitudinal axis, and
a second end; and
a leaf-spring connector comprising:
a leaf-spring-connector longitudinal axis,
a first end that is mechanically and electrically connected to the second end of the pogo-pin connector at a junction point having a fork connection, and
a second end that comprises a contact portion; wherein
when the pogo-pin connector and the leaf-spring connector are connected, (i) the pogo-pin-connector longitudinal axis and the leaf-spring-connector longitudinal axis are substantially parallel and (ii) the contact portion of the leaf-spring connector is configured to exert a force substantially normal to the substantially parallel longitudinal axes.

18. The electrical connector of claim 17, further comprising a connector housing configured to retain the connected pogo-pin connector and the leaf-spring connector such that:

the first end of the pogo-pin connector protrudes through a pogo-pin opening in the connector housing; and the contact portion of the leaf-spring connector is configured to provide an electrical path to an adjacent printed circuit board (PCB) contact pad.

19. The electrical connector of claim 18, the connector housing further comprising a leaf-spring opening, wherein the contact portion of the leaf-spring connector is configured to protrude through the leaf-spring opening.

* * * * *